(12) United States Patent
Akimoto et al.

(10) Patent No.: US 9,893,200 B2
(45) Date of Patent: Feb. 13, 2018

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Kengo Akimoto, Atsugi (JP); Junichiro Sakata, Atsugi (JP); Takuya Hirohashi, Atsugi (JP); Masahiro Takahashi, Chigasaki (JP); Hideyuki Kishida, Atsugi (JP); Akiharu Miyanaga, Hadano (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/972,964

(22) Filed: Dec. 17, 2015

(65) Prior Publication Data

US 2016/0111282 A1    Apr. 21, 2016

Related U.S. Application Data

(63) Continuation of application No. 14/140,044, filed on Dec. 24, 2013, now Pat. No. 9,252,288, which is a
(Continued)

(30) Foreign Application Priority Data

Nov. 20, 2008    (JP) .................................. 2008-296901

(51) Int. Cl.
*H01L 29/04*    (2006.01)
*H01L 29/786*    (2006.01)
(Continued)

(52) U.S. Cl.
CPC .... *H01L 29/7869* (2013.01); *H01L 21/02565* (2013.01); *H01L 21/28079* (2013.01);
(Continued)

(58) Field of Classification Search
CPC ..................... H01L 29/7869; H01L 29/78693
See application file for complete search history.

(56) References Cited

U.S. PATENT DOCUMENTS

| 5,731,856 | A | 3/1998 | Kim et al. |
|---|---|---|---|
| 5,744,864 | A | 4/1998 | Cillessen et al. |

(Continued)

FOREIGN PATENT DOCUMENTS

| CN | 001610080 A | 4/2005 |
|---|---|---|
| CN | 001941299 A | 4/2007 |

(Continued)

OTHER PUBLICATIONS

Chinese Office Action (Application No. 201410612094.8) dated Oct. 27, 2016.
(Continued)

*Primary Examiner* — Stephen W Smoot
*Assistant Examiner* — Sun M King
(74) *Attorney, Agent, or Firm* — Robinson Intellectual Property Law Office; Eric J. Robinson

(57) ABSTRACT

It is an object to provide an oxide semiconductor which is suitable for use in a semiconductor device. Alternatively, it is another object to provide a semiconductor device using the oxide semiconductor. Provided is a semiconductor device including an In—Ga—Zn—O based oxide semiconductor layer in a channel formation region of a transistor. In the semiconductor device, the In—Ga—Zn—O based oxide semiconductor layer has a structure in which crystal grains represented by $InGaO_3(ZnO)_m$ ($m=1$) are included in an amorphous structure represented by $InGaO_3(ZnO)_m$ ($m>0$).

14 Claims, 16 Drawing Sheets

Related U.S. Application Data continuation of application No. 13/677,504, filed on Nov. 15, 2012, now Pat. No. 8,643,011, which is a continuation of application No. 12/618,944, filed on Nov. 16, 2009, now Pat. No. 8,329,506.

(51) Int. Cl.
  *H01L 29/66* (2006.01)
  *H01L 21/02* (2006.01)
  *H01L 21/28* (2006.01)

(52) U.S. Cl.
  CPC ........ *H01L 21/28158* (2013.01); *H01L 29/04* (2013.01); *H01L 29/66742* (2013.01); *H01L 29/66969* (2013.01); *H01L 29/78693* (2013.01)

(56) References Cited

U.S. PATENT DOCUMENTS

| | | | |
|---|---|---|---|
| 5,847,410 | A | 12/1998 | Nakajima |
| 6,294,274 | B1 | 9/2001 | Kawazoe et al. |
| 6,563,174 | B2 | 5/2003 | Kawasaki et al. |
| 6,586,346 | B1 | 7/2003 | Yamazaki et al. |
| 6,727,522 | B1 | 4/2004 | Kawasaki et al. |
| 6,960,812 | B2 | 11/2005 | Yamazaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,301,211 | B2 | 11/2007 | Yamazaki et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,683,370 | B2 | 3/2010 | Kugimiya et al. |
| 7,696,513 | B2 | 4/2010 | Hayashi et al. |
| 7,732,819 | B2 | 6/2010 | Akimoto et al. |
| 7,767,505 | B2 * | 8/2010 | Son .................. H01L 29/66969 257/E21.561 |
| 7,804,091 | B2 | 9/2010 | Takechi et al. |
| 7,829,444 | B2 | 11/2010 | Yabuta et al. |
| 7,851,792 | B2 | 12/2010 | Aiba et al. |
| 7,855,379 | B2 | 12/2010 | Hayashi et al. |
| 7,884,360 | B2 | 2/2011 | Takechi et al. |
| 7,910,490 | B2 | 3/2011 | Akimoto et al. |
| 7,910,920 | B2 | 3/2011 | Park et al. |
| 7,932,521 | B2 | 4/2011 | Akimoto et al. |
| 7,968,884 | B2 | 6/2011 | Yamazaki et al. |
| 8,013,331 | B2 | 9/2011 | Wakita |
| 8,063,421 | B2 | 11/2011 | Kang et al. |
| 8,088,652 | B2 | 1/2012 | Hayashi et al. |
| 8,153,031 | B2 | 4/2012 | Yano et al. |
| 8,154,017 | B2 | 4/2012 | Yabuta et al. |
| 8,232,552 | B2 | 7/2012 | Yano et al. |
| 8,274,077 | B2 | 9/2012 | Akimoto et al. |
| 8,319,218 | B2 | 11/2012 | Yamazaki et al. |
| 8,415,198 | B2 | 4/2013 | Itagaki et al. |
| 8,420,442 | B2 | 4/2013 | Takechi et al. |
| 8,436,349 | B2 | 5/2013 | Sano et al. |
| 8,466,463 | B2 | 6/2013 | Akimoto et al. |
| 8,502,222 | B2 | 8/2013 | Yabuta et al. |
| 8,614,442 | B2 | 12/2013 | Park et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 * | 7/2004 | Carcia .................. C23C 14/086 438/689 |
| 2005/0017302 | A1 | 1/2005 | Hoffman |
| 2005/0090078 | A1 | 4/2005 | Ishihara |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228898 | A1 | 10/2006 | Wajda et al. |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0067508 | A1 | 3/2008 | Endo et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0203387 | A1 | 8/2008 | Kang et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308796 | A1 | 12/2008 | Akimoto et al. |
| 2008/0308797 | A1 | 12/2008 | Akimoto et al. |
| 2008/0308804 | A1 | 12/2008 | Akimoto et al. |
| 2008/0308805 | A1 | 12/2008 | Akimoto et al. |
| 2008/0308806 | A1 | 12/2008 | Akimoto et al. |
| 2008/0318367 | A1 * | 12/2008 | Shimomura ...... H01L 21/26506 438/151 |
| 2009/0008639 | A1 | 1/2009 | Akimoto et al. |
| 2009/0032096 | A1 * | 2/2009 | Tanaka .................. H01L 31/032 136/256 |
| 2009/0065771 | A1 | 3/2009 | Iwasaki et al. |
| 2009/0068773 | A1 | 3/2009 | Lai et al. |
| 2009/0072233 | A1 | 3/2009 | Hayashi et al. |

(56) References Cited

U.S. PATENT DOCUMENTS

| | | |
|---|---|---|
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0272970 A1 | 11/2009 | Aiba et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0325341 A1 | 12/2009 | Itagaki et al. |
| 2010/0025678 A1 | 2/2010 | Yamazaki et al. |
| 2010/0065844 A1 | 3/2010 | Tokunaga |
| 2010/0072470 A1 | 3/2010 | Yamazaki et al. |
| 2010/0092800 A1 | 4/2010 | Itagaki et al. |
| 2010/0109002 A1 | 5/2010 | Itagaki et al. |
| 2010/0117999 A1 | 5/2010 | Matsunaga et al. |
| 2010/0136743 A1 | 6/2010 | Akimoto et al. |
| 2010/0140612 A1 | 6/2010 | Omura et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0254004 A1 | 10/2011 | Yamazaki et al. |
| 2013/0126344 A1 | 5/2013 | Chau et al. |
| 2013/0277672 A1 | 10/2013 | Sano et al. |
| 2015/0318405 A1 | 11/2015 | Hayashi et al. |

FOREIGN PATENT DOCUMENTS

| | | | |
|---|---|---|---|
| CN | 101057339 A | 10/2007 | |
| EP | 1737044 A | 12/2006 | |
| EP | 1770788 A | 4/2007 | |
| EP | 1995787 A | 11/2008 | |
| EP | 1998373 A | 12/2008 | |
| EP | 1998374 A | 12/2008 | |
| EP | 1998375 A | 12/2008 | |
| EP | 2226847 A | 9/2010 | |
| EP | 2453480 A | 5/2012 | |
| EP | 2453481 A | 5/2012 | |
| EP | 2455975 A | 5/2012 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 03-231472 A | 10/1991 | |
| JP | 05-251705 A | 9/1993 | |
| JP | 07-235219 A | 9/1995 | |
| JP | 08-264794 A | 10/1996 | |
| JP | 11-505377 | 5/1999 | |
| JP | 2000-026119 A | 1/2000 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273145 A | 9/2004 | |
| JP | 2004-273732 A | 9/2004 | |
| JP | 2005-129666 A | 5/2005 | |
| JP | 2006-165529 A | 6/2006 | |
| JP | 2007-073559 A | 3/2007 | |
| JP | 2007-096055 A | 4/2007 | |
| JP | 2007-115735 A | 5/2007 | |
| JP | 2007-115902 A | 5/2007 | |
| JP | 2007-123861 A | 5/2007 | |
| JP | 2007-150158 A | 6/2007 | |
| JP | 2007-158307 A | 6/2007 | |
| JP | 2007-173489 A | 7/2007 | |
| JP | 2007-250983 A | 9/2007 | |
| JP | 2007-250984 A | 9/2007 | |
| JP | 2007-311404 A | 11/2007 | |
| JP | 2008-042088 A | 2/2008 | |
| JP | 2008-053356 A | 3/2008 | |
| JP | 2008-171989 A | 7/2008 | |
| JP | 2008-205469 A | 9/2008 | |
| JP | 2008-219008 A | 9/2008 | |
| JP | 2008-235871 A | 10/2008 | |
| JP | 2008-243928 A | 10/2008 | |
| JP | 2008-276212 A | 11/2008 | |
| JP | 2008-277326 A | 11/2008 | |
| JP | 2007/148601 | 11/2009 | |
| KR | 2008-0052428 A | 6/2008 | |
| TW | 200717651 | 5/2007 | |
| TW | 200822372 | 5/2008 | |
| WO | WO-2004/114391 | 12/2004 | |
| WO | WO-2005/088726 | 9/2005 | |
| WO | WO-2006/051993 | 5/2006 | |
| WO | WO-2006/107417 | 10/2006 | |
| WO | WO-2007/055256 | 5/2007 | |
| WO | WO-2007/119321 | 10/2007 | |
| WO | WO-2007/119386 | 10/2007 | |
| WO | WO-2008/023553 | 2/2008 | |
| WO | WO-2008/105347 | 9/2008 | |
| WO | WO-2008/126884 | 10/2008 | |
| WO | WO-2008/133220 | 11/2008 | |
| WO | WO-2008/139654 | 11/2008 | |
| WO | WO 2008149873 A1 * | 12/2008 | ....... H01L 29/78618 |

OTHER PUBLICATIONS

Dembo.H et al., "RFCPUS on Glass and Plastic Substrated Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IgZo Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistors", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

(56) References Cited

OTHER PUBLICATIONS

Tsuda.K et al., "Ultra Low Power Consumption Technologies for Mobile TFT-LCDs ", IDW '02 : Proceedings of the 9TH International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technicals Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperates Over 1000°C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission

(56) References Cited

OTHER PUBLICATIONS

AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Jouranl of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Yabuta.H et al., "High-Mobility Thin-Film Transistor With Amorphous InGaZnO4 Channel Fabricated by Room Temperature RF-Magnetron Sputtering", Appl. Phys. Lett. (Applied Physics Letters), 2006, vol. 89, pp. 112123-1-112123-3.

Kim.D et al., "Thickness Dependence of Gate Dielectric and Active Semiconductor on InGaZnO4 TFT Fabricated on Plastic Substrates", Electrochemical and Solid-State Letters, 2008, vol. 11, No. 12, pp. H317-H319.

Chinese Office Action (Application No. 200910226491.0) dated May 27, 2013.

Taiwanese Office Action (Application No. 098138245) dated Dec. 3, 2014.

* cited by examiner

FIG. 2

| flow rate (sccm) | composition (atomic%) | | | | composition formula |
|---|---|---|---|---|---|
| Ar/O$_2$ | In | Ga | Zn | O | |
| 10/5 | 17.7 | 16.7 | 7 | 58.6 | InGa$_{0.94}$Zn$_{0.40}$O$_{3.31}$ |
| 40/0 | 17.6 | 16.7 | 7.2 | 58.6 | InGa$_{0.95}$Zn$_{0.41}$O$_{3.33}$ |

FIG. 3

| flow rate (sccm) | composition (atomic%) | | | | | composition formula |
|---|---|---|---|---|---|---|
| Ar/O$_2$ | In | Ga | Zn | O | Ar | |
| 10/5 | 16 | 14.7 | 7.2 | 61.7 | 0.4 | InGa$_{0.92}$Zn$_{0.45}$O$_{3.86}$ |
| 40/0 | 17 | 15.8 | 7.5 | 59.4 | 0.3 | InGa$_{0.93}$Zn$_{0.44}$O$_{3.49}$ |

FIG. 10

| Structure | Difference in energy (eV) |
|---|---|
| 1 (U1+L1) | 0 |
| 2 (U1+L4) | 0.25 |
| 3 (U1+L2) | 0.15 |
| 4 (U7+L7) | 0.22 |
| 5 (U7+L10) | 0.39 |
| 6 (U11+L11) | 0.77 |

FIG. 13

| Compound | $E_{VO}$ (eV) |
|---|---|
| $In_2O_3$ | 3.06 |
| ZnO | 3.75 |
| IGZO(Model 1) | 3.73 |
| IGZO(Model 2) | 3.98 |
| IGZO(Model 3) | 4.08 |
| $Ga_2O_3$ | 4.18 |

 Ga in the upper layer   Ga in the lower layer
 Zn in the upper layer   Zn in the lower layer

FIG. 15

| Distribution | The number of nearest neighbor atoms of the same kind | Energy (eV) |
|---|---|---|
| (a) | 0 | 0.77 |
| (b) | 2 | 0.25 |
| (c) | 1.5 | 0.15 |
| (d) | 1 | 0 |

SEMICONDUCTOR DEVICE AND METHOD FOR MANUFACTURING THE SAME

BACKGROUND OF THE INVENTION

1. Field of the Invention

The present invention relates to a semiconductor device using an oxide semiconductor and a method for manufacturing the semiconductor device.

2. Description of the Related Art

A field-effect transistor (also referred to as an FET) is the most widely-used semiconductor element at present. A variety of materials are used for field-effect transistors according to their uses. In particular, semiconductor materials including silicon are frequently used.

The field-effect transistor using silicon has characteristics satisfying the needs with respect to a variety of uses. For example, single crystal silicon is used for an integrated circuit or the like which needs to be operated at a high speed, whereby the need with respect to the integrated circuit is satisfied. Further, amorphous silicon is used for an object which needs a large area, such as a display device, whereby the need with respect to the object can be satisfied.

As described above, silicon is highly versatile and can be used for various purposes. However, in recent years, semiconductor materials tend to be expected to have higher performance as well as versatility. For example, in terms of improving performance of a large-area display device, in order to realize high-speed operation of a switching element, a semiconductor material which facilitates increase of the area of a display device and has higher performance than amorphous silicon is needed.

Under such conditions, a technique relating to a field-effect transistor using an oxide semiconductor has attracted attention. For example, in Patent Document 1, a transparent thin film field-effect transistor using a homologous compound $InMO_3(ZnO)_m$ (M is In, Fe, Ga, or Al, and m is an integer number of greater than or equal to 1 and less than 50) is disclosed.

In addition, in Patent Document 2, a field-effect transistor is disclosed in which an amorphous oxide semiconductor whose electron carrier concentration is less than $10^{18}/cm^3$ and which contains In, Ga, and Zn is used. Note that in Patent Document 2, the ratio of In:Ga:Zn equals to 1:1:m (m<6) in the amorphous oxide semiconductor.

Further, in Patent Document 3, a field-effect transistor is disclosed in which an amorphous oxide semiconductor including a microcrystal is used for an active layer.

REFERENCES

[Patent Document 1]
Japanese Published Patent Application No. 2004-103957
[Patent Document 2]
PCT International Publication No. 05/088726
[Patent Document 3]
Japanese Published Patent Application No. 2006-165529

SUMMARY OF THE INVENTION

In Patent Document 3, a disclosure is given in which a composition in a crystal state is $InGaO_3(ZnO)_m$ (m is an integer number of less than 6). Further, in Example 1 of Patent Document 3, a case of $InGaO_3(ZnO)_4$ is disclosed. However, in the real condition, adequate characteristics have not been obtained even when such oxide semiconductors are used.

In view of the foregoing problems, it is an object to provide an oxide semiconductor which is suitable for use in a semiconductor device. Alternatively, it is another object to provide a semiconductor device using the oxide semiconductor.

In the invention to be disclosed, a semiconductor device is manufactured such that crystal grains represented by $InGaO_3(ZnO)_m$ (m=1) are included in an amorphous structure represented by $InGaO_3(ZnO)_m$ (m>0). Specifics are described below.

One embodiment of the invention to be disclosed is a semiconductor device including an In—Ga—Zn—O based oxide semiconductor layer used for a channel formation region of a transistor. In the semiconductor device, the In—Ga—Zn—O based oxide semiconductor layer has a structure in which crystal grains represented by $InGaO_3(ZnO)_m$ (m=1) are included in an amorphous structure represented by $InGaO_3(ZnO)_m$ (m>0).

In the above, a Zn content (atomic %) in the In—Ga—Zn—O based oxide semiconductor layer is preferably less than an In content (atomic %) and less than a Ga content (atomic %). Further, the oxide semiconductor layer is preferably formed by a sputtering method using a target in which a Zn content (atomic %) is less than or equal to an In content (atomic %) and less than or equal to a Ga content (atomic %). Further, in the above, it is preferable that only crystal grains each having a structure represented by $InGaO_3(ZnO)_m$ (m=1) be used. However, under the conditions where the proportion of the structure represented by $InGaO_3(ZnO)_m$ (m=1) in crystal grains is 80 vol % or more, given characteristics can be obtained.

Another embodiment of the invention to be disclosed is a method for manufacturing a semiconductor device including the steps of: forming an In—Ga—Zn—O based oxide semiconductor layer having an amorphous structure over a substrate by a sputtering method; and subjecting the oxide semiconductor layer to heat treatment to form an oxide semiconductor layer including crystal grains represented by $InGaO_3(ZnO)_m$ (m=1) in an amorphous structure represented by $InGaO_3(ZnO)_m$ (m>0). In the method for manufacturing a semiconductor device, the oxide semiconductor layer including crystal grains is used for a channel formation region of a transistor.

In the above, the In—Ga—Zn—O based oxide semiconductor layer having an amorphous structure is preferably formed such that a Zn content (atomic %) is less than an In content (atomic %) and less than a Ga content (atomic %). Further, the In—Ga—Zn—O based oxide semiconductor layer having an amorphous structure is preferably formed by a sputtering method using a target in which a Zn content (atomic %) is less than or equal to an In content (atomic %) and less than or equal to a Ga content (atomic %). Furthermore, the heat treatment is preferably performed at 350° C. or more.

Note that in this specification, a semiconductor device means any device which can function by utilizing semiconductor characteristics; and a display device, a semiconductor circuit, and an electronic device are all included in the semiconductor devices.

Crystal grains represented by $InGaO_3(ZnO)_m$ (m=1) are included in an amorphous structure represented by $InGaO_3(ZnO)_m$ (m>0), whereby the electrical characteristics of an

BRIEF DESCRIPTION OF THE DRAWINGS

FIG. 2 is a table showing the results of analyzing the compositions of non-single-crystal semiconductor layers.

FIG. 3 is a table showing the results of analyzing the compositions of non-single-crystal semiconductor layers.

FIG. 10 is a table showing the result of comparing the energy of the distribution patterns of elements.

FIG. 13 is a table showing the result of calculating geometrical optimal values of $E_{VO}$.

FIG. 15 is a table showing the energy of each combination.

DETAILED DESCRIPTION OF THE INVENTION

Figure 1A:
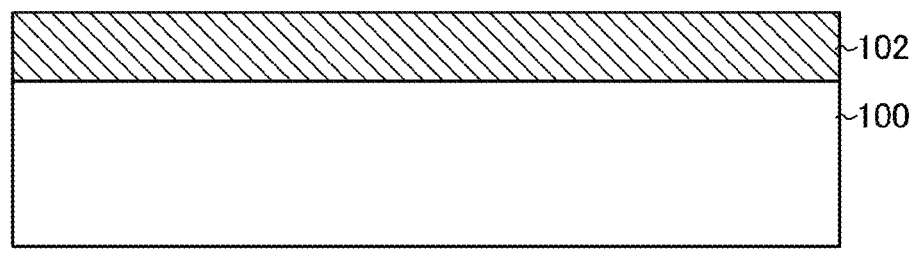
FIGS. 1A and 1B are explanatory views of a manufacturing process of an oxide semiconductor layer relating to Embodiment 1.

Embodiments will be described in detail with reference to drawings. However, the present invention is not limited to the description of embodiments given below, and it will be obvious to those skilled in the art that various changes and modifications in modes and details thereof can be made without departing from the purpose of the present invention. Further, structures relating to different embodiments can be used in combination as appropriate. Note that the same portion or a portion having the same function is denoted by the same reference numeral in structures of the present invention described below, and the repetitive explanation thereof is omitted.

(Embodiment 1)

In this embodiment, a method for manufacturing an oxide semiconductor layer in which crystal grains represented by $InGaO_3(ZnO)_m$ (m=1) are included in an amorphous structure represented by $InGaO_3(ZnO)_m$ (m>0) (the oxide semiconductor layer is referred to as an In—Ga—Zn—O based oxide semiconductor layer) is described with reference to drawings.

First, an In—Ga—Zn—O based non-single-crystal semiconductor layer 102 is formed over a formation surface (here, over a substrate 100) (see FIG. 1A). For example, the non-single-crystal semiconductor layer 102 can be formed by a sputtering method using an oxide semiconductor target including indium (In), gallium (Ga), and zinc (Zn). For example, the following conditions may be employed for the sputtering: a distance between the substrate 100 and the oxide semiconductor target is 30 mm to 500 mm; the pressure is 0.1 Pa to 2.0 Pa; the DC power source is 0.2 kW to 5.0 kW (when the target with a size of 8-inch in diameter is used); and the atmosphere is an argon atmosphere, an oxygen atmosphere, or a mixed atmosphere of argon and oxygen.

Here, the non-single-crystal semiconductor layer 102 is formed under the following conditions: the composition of the oxide semiconductor target is set such that the ratio of $In_2O_3:Ga_2O_3:ZnO$ equals to 1:1:1; the distance between the substrate 100 and the oxide semiconductor target is 170 mm; the pressure is 0.4 Pa; the DC power is 0.5 kW; the flow rate of an argon gas is 10 sccm; and the flow rate of an oxygen gas is 5 sccm.

Then, the composition of a sample manufactured by the above-described method is analyzed by inductively coupled plasma mass spectrometry (ICP-MS). The composition of the non-single-crystal semiconductor layer 102 formed under the conditions where the flow rate of an argon gas is 10 sccm and the flow rate of an oxygen gas is 5 sccm is $InGa_{0.94}Zn_{0.40}O_{3.31}$. FIG. 2 shows the result of the above-described analysis and the result of analyzing a non-single-crystal semiconductor layer formed under the conditions where the flow rate of an argon gas is 40 sccm and the flow rate of an oxygen gas is 0 sccm.

Further, FIG. 3 shows the results of analyses using Rutherford backscattering spectrometry (RBS) as an analysis method.

FIG. 2 and FIG. 3 show that Ga and Zn contents in a non-single-crystal semiconductor layer tend to be lower than that in the composition of the target. In addition, the results of analyzing the non-single-crystal semiconductor layers are different depending on manufacturing conditions, an analysis method, and the like.

Figure 1B:
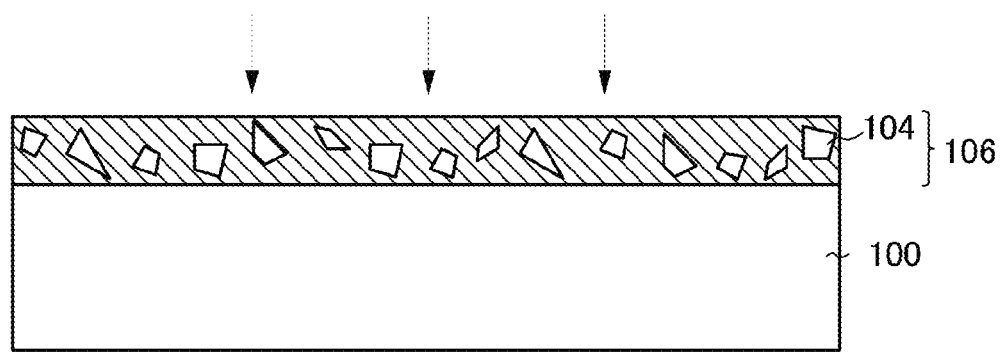

Next, the non-single-crystal semiconductor layer is subjected to heat treatment at a temperature of 350° C. to 800° C. (preferably, 500° C. to 750° C.) for about 10 minutes to 200 minutes, whereby an oxide semiconductor layer 106 including crystal grains 104 in an amorphous structure is obtained (see FIG. 1B). A thin film transistor manufactured using the oxide semiconductor layer 106 has good electrical characteristics: the on/off ratio is $10^9$ or higher and mobility is 10 cm$^2$/Vs or higher at a gate voltage of ±20 V. Note that, here, the heat treatment is performed at a temperature of 700° C. for one hour.

After the heat treatment is performed, the structure of the oxide semiconductor layer 106 is analyzed. Specifically, the cross section of the sample is observed with respect to a scanning transmission electron microscope (STEM) image.

Figure 4A:
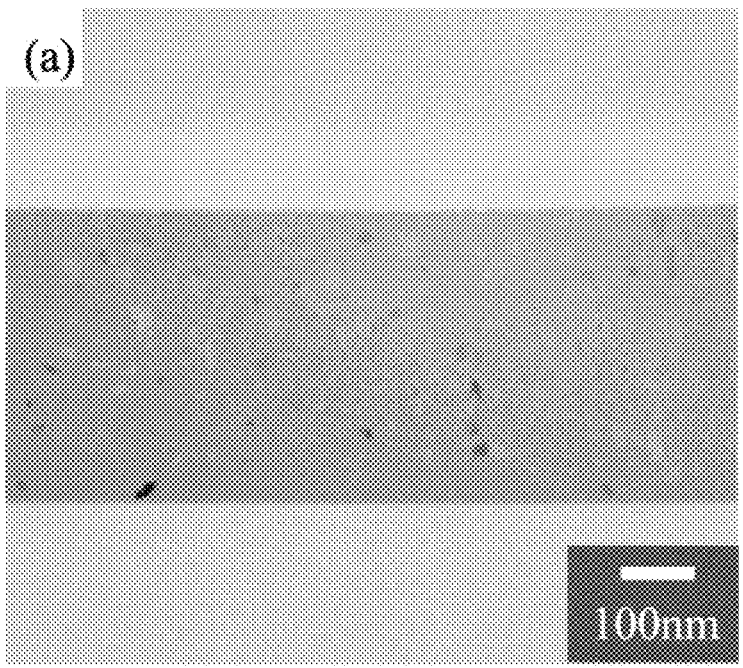
FIGS. 4A and 4B are bright-field-STEM images of oxide semiconductor layers.
Figure 4B:
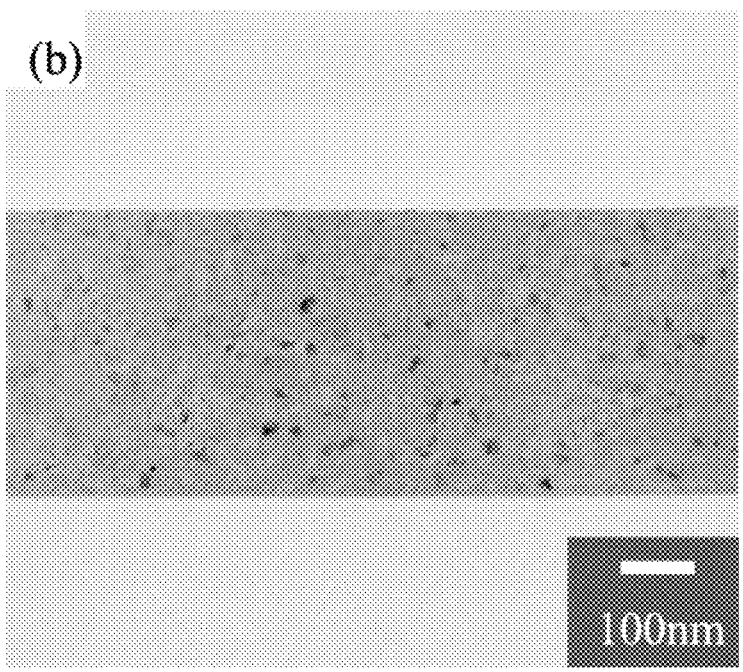

FIGS. 4A and 4B are bright-field-STEM images of the samples. FIG. 4A is a STEM image of a sample manufactured using a target of $In_2O_3:Ga_2O_3:ZnO=1:1:1$ (In:Ga:Zn=1:1:0.5) (hereinafter, a target A). FIG. 4B is a STEM image of a sample manufactured using a target of $In_2O_3:Ga_2O_3:ZnO=1:1:2$ (In:Ga:Zn=1:1:1) (hereinafter, a target B) instead of the target A for comparison with the above sample.

FIG. 4A shows that the oxide semiconductor layer 106 manufactured by the above method has a structure including the crystal grains 104 in the amorphous structure.

Note that as seen from the comparison between FIG. 4A and FIG. 4B, in the case where a Zn content in a target is low, the speed of crystal growth is lower than that in the case where a Zn content in a target is high. By utilizing this fact, the controllability of crystal growth can be improved. For example, the Zn content (atomic %) in the non-single-crystal semiconductor layer 102 is made lower than the In content (atomic %) and lower than the Ga content (atomic %), whereby the oxide semiconductor layer 106 with good properties can be formed with good controllability. When the speed of crystal growth is valued, the zinc content in the non-single-crystal semiconductor layer 102 may be made high.

Figure 5A:
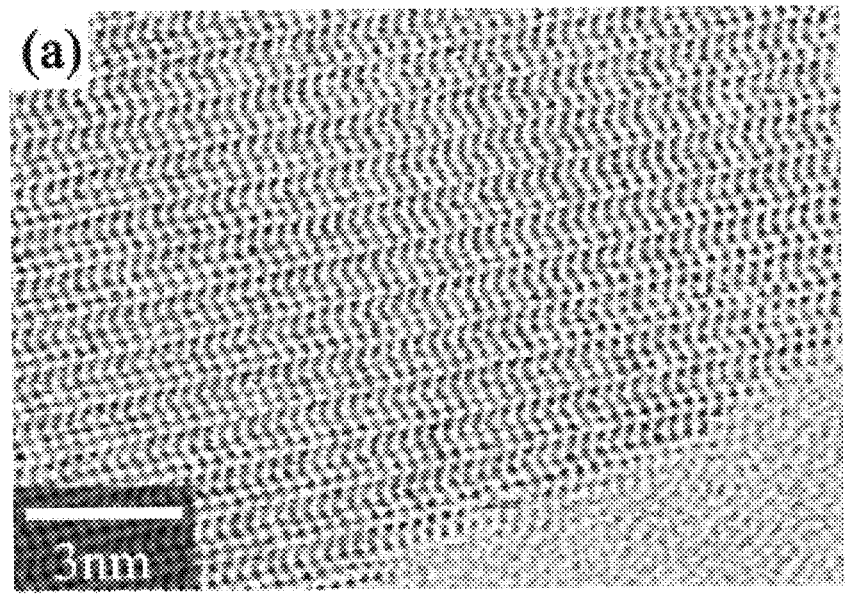
FIGS. 5A and 5B are a bright-field-STEM image and a HAADF-STEM image, respectively.
Figure 5B:
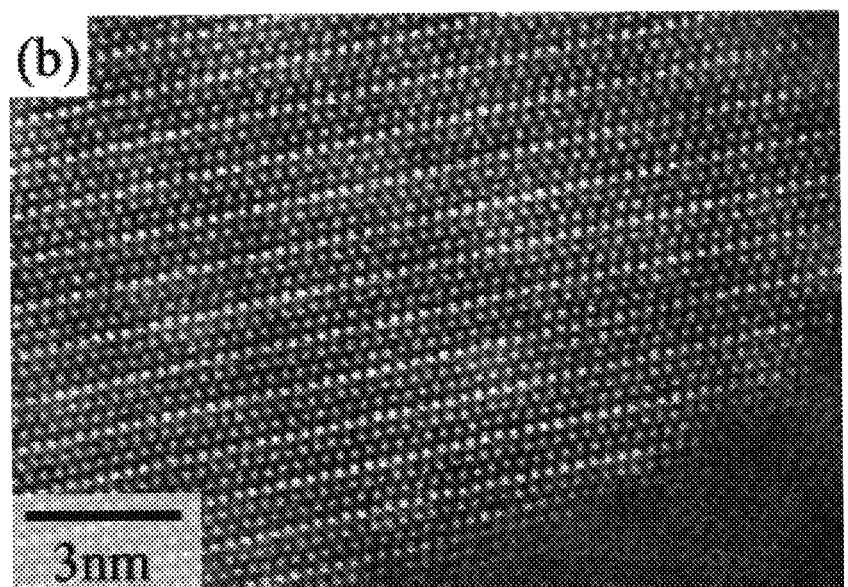

Next, a minuter region of the sample is observed by a STEM. FIGS. 5A and 5B are STEM images of the sample manufactured using the target A. FIG. 5A is a bright-field-STEM image, and FIG. 5B is a high-angle annular dark field (HAADF)-STEM image. In FIG. 5A, a regular structure can be seen; however, it is difficult to locate each atom, and in addition, crystal orientation cannot be detected. On the other hand, in FIG. 5B, the positions of white dots corresponding to each atom can be precisely detected. Further, as can be seen from FIG. 5B, an amorphous structure is left in a lower right region of FIG. 5B.

In a HAADF-STEM image, a contrast proportional to the square of an atomic number is obtained; therefore, the brighter dot indicates the heavier atom. In FIG. 5B, brighter dots represent In and darker dots represent Ga or Zn.

Figure 6A:
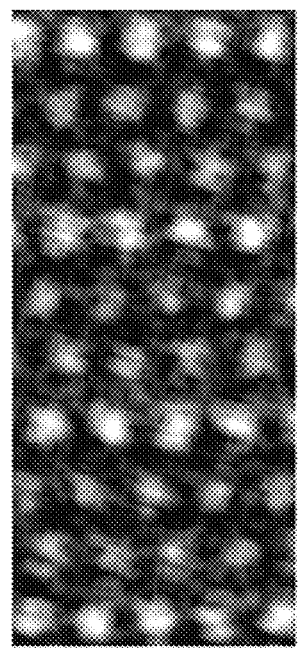
FIGS. 6A and 6B are an enlarged image of a crystal structure and a model view of the crystal structure, respectively.
Figure 6B:
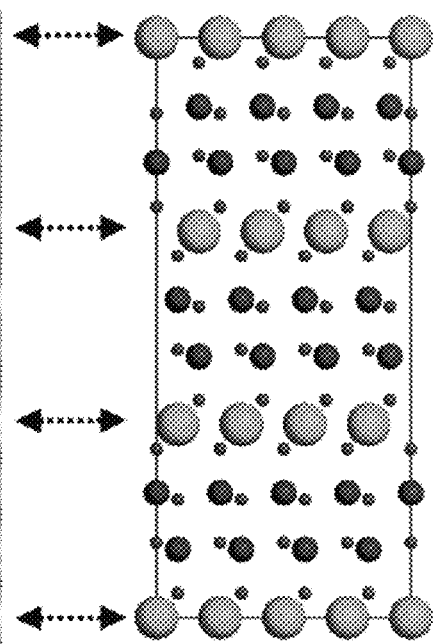

Next, the above crystal structure is considered with reference to FIGS. 6A and 6B. Here, FIG. 6A is an enlarged view (an enlarged image) of FIG. 5B. FIG. 6B is a model view of the crystal structure of $InGaZnO_4$ (corresponding to $InGaO_3(ZnO)_m$, where m is 1) which is seen from a [100] direction. A comparison between FIGS. 6A and 6B shows that crystal grains in the sample manufactured using the target A has a crystal structure of $InGaO_3(ZnO)_1$. Note that it is likely that In and Ga contribute to electrical conduction in an In—Ga—Zn—O based oxide semiconductor. Therefore, in order to maintain good electrical characteristics, the higher the proportion of a crystal structure with a high proportion of In and Ga is, in other words, the higher the proportion of the crystal structure of $InGaO_3(ZnO)_m$ (m=1) is, the more preferable.

Figure 7A:
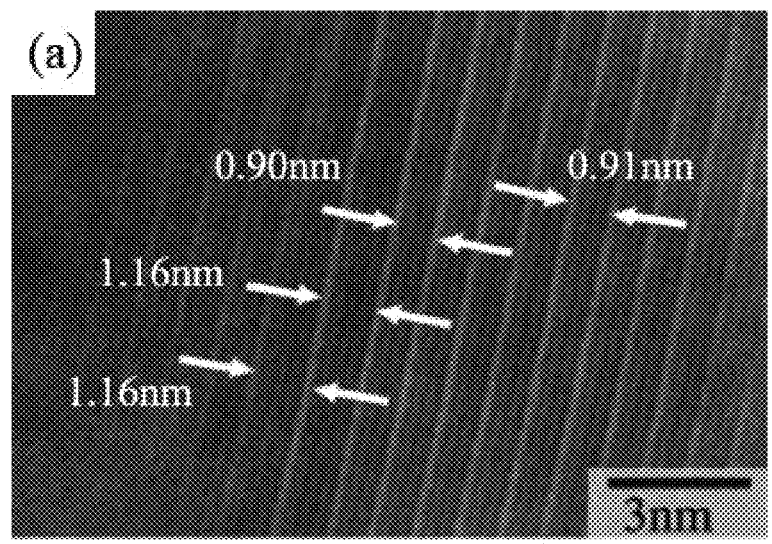
FIGS. 7A and 7B are HAADF-STEM images of an oxide semiconductor layer (a target B).
Figure 7B:
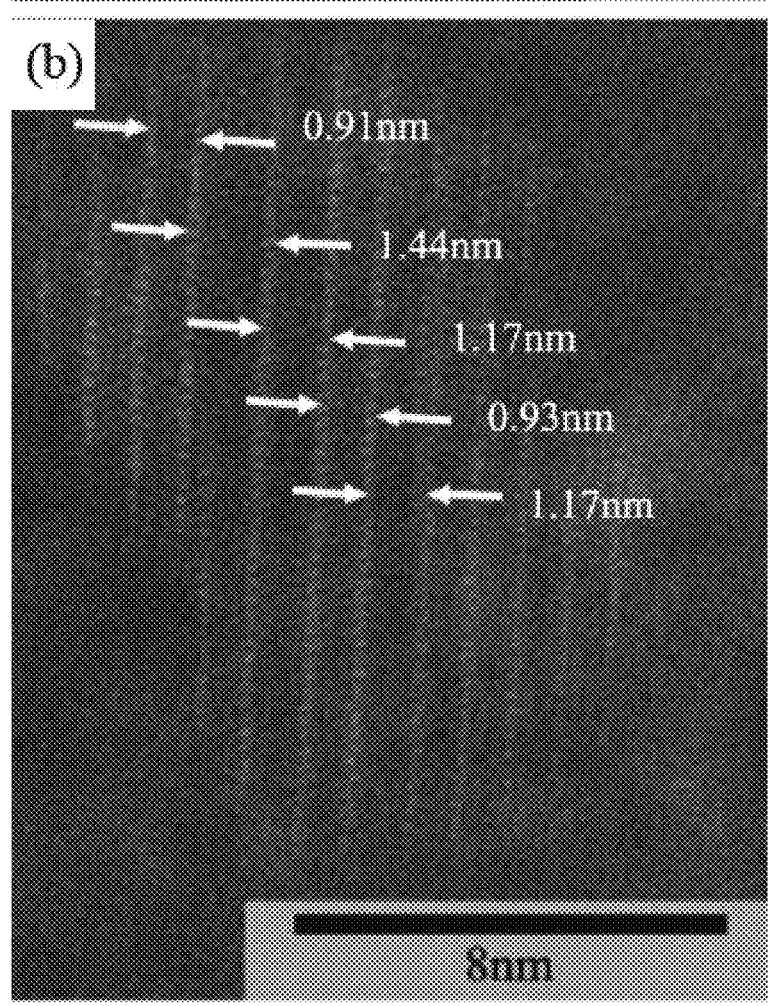

FIGS. 7A and 7B are HAADF-STEM images of a sample manufactured using the target B. In FIGS. 7A and 7B, bright dots are regularly present so as to form lines. The distances between lines of the bright dots are approximately 0.9 nm, approximately 1.15 nm, and approximately 1.4 nm, which correspond to the distances between indium atoms in the crystal structures of $InGaO_3(ZnO)_m$ where m=1, m=2, and m=3, respectively. That is, it can be said that the sample manufactured using the target B has crystals of a plurality of compositions, i.e., crystals of $InGaO_3(ZnO)_m$ where m is at least 1 to 3.

As described above, in an In—Ga—Zn—O based oxide semiconductor, In and Ga contribute to electrical conduction. Therefore, under the conditions where the proportion of In and Ga is low (that is, under the condition where m is large), the electrical characteristics get worse. Thus, by making the proportion of the structure of $InGaO_3(ZnO)_m$ (m=1) high, the electrical characteristics can be maintained in a good state. In specific, the proportion of the crystal structure of $InGaO_3(ZnO)_m$ (m=1) in the whole crystal structure is preferably 80 volume % or higher, more preferably 90 volume % or higher.

As one method for making the proportion of the crystal structure of $InGaO_3(ZnO)_m$ (m=1) high, there is a method for forming the non-single-crystal semiconductor layer 102 with a low Zn content by using a target with a low Zn content. For example, a Zn content (atomic %) in the non-single-crystal semiconductor layer 102 may be lower than an In content (atomic %) and lower than a Ga content (atomic %) in the non-single-crystal semiconductor layer 102. A Zn content in the non-single-crystal semiconductor layer 102 is made low, whereby the crystal structure with good electrical characteristics can be obtained.

The electronic structure of an In—Ga—Zn—O based oxide semiconductor has not been sufficiently elucidated, and it is likely that the elucidation of the electronic structure leads to understanding of electrical characteristics of an oxide semiconductor. Thus, the result of calculating an In—Ga—Zn—O based oxide semiconductor by the first principle calculation and the consideration thereof are described below. Note that although the result given below is obtained by calculating the crystal structure, the result can be similarly adapted to an amorphous structure including crystal grains.

Figure 8:
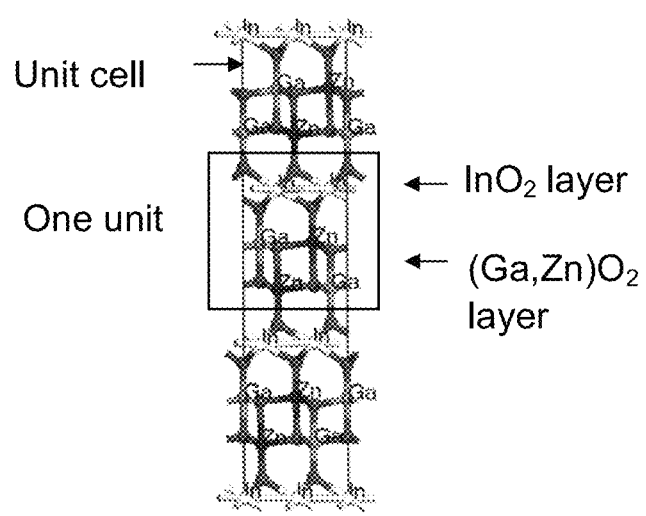
FIG. 8 is a view illustrating a crystal structure of an oxide semiconductor ($InGaZnO_4$).

FIG. 8 illustrates the crystal structure of an In—Ga—Zn—O based oxide semiconductor ($InGaZnO_4$) which is obtained by calculation. The unit cell of the crystal structure of $InGaZnO_4$ includes 21 atoms. However, here, the calculation is performed with respect to an enlarged unit including 84 atoms (2×2×1) in order to examine the distribution of Ga atoms.

The calculation is performed using CASTEP. CASTEP is a first principle calculation program based on the density functional theory (DFT) and the plane wave pseudo-potential method. For exchange correlation functional, generalized-gradient approximation (GGA) and Perdew-Burke-Ernzerhof (PBE) are selected here. The cut-off energy is set to 500 eV, and the K-point grid of 3×3×1 is used.

FIG. 8 shows that the unit cell includes two (Ga, Zn)$O_2$ layers and one $InO_2$ layer. Note that here, the crystal structure with repeated unit cells including specified atom distribution is assumed for simplicity.

Figure 9A:
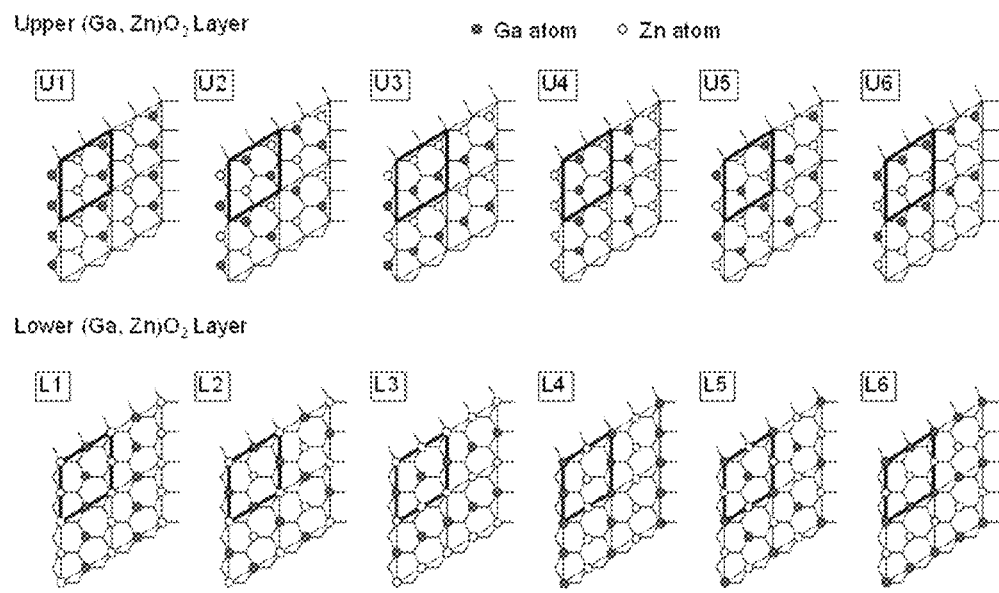
FIGS. 9A and 9B are views illustrating the distributions of Ga atoms and Zn atoms in (Ga, Zn)$O_2$ layers.
Figure 9B:
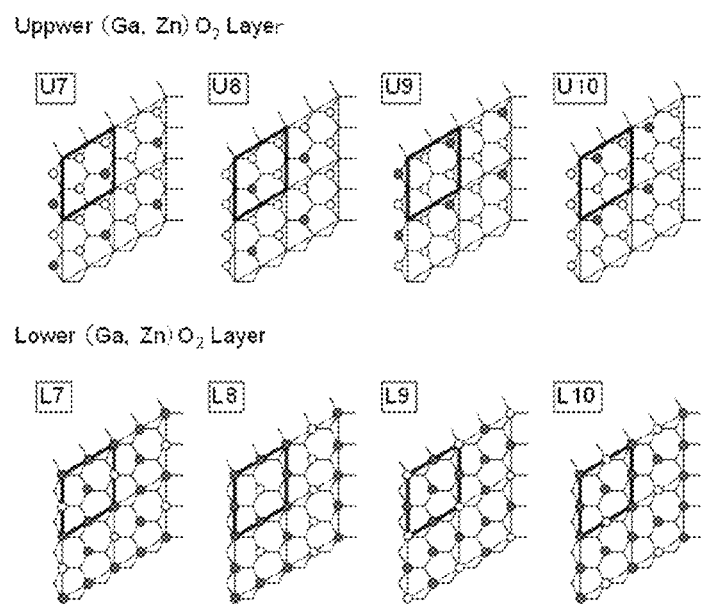

FIGS. 9A and 9B show the distributions of Ga atoms and Zn atoms in two (Ga, Zn)$O_2$ layers in unit cells. FIGS. 9A and 9B show structures of 2×2 times unit cells, i.e., structures each including 4 unit cells. Further, heavy lines in FIGS. 9A and 9B represent a unit cell. FIG. 9A shows the case where two Ga atoms are present in each of an upper and a lower layer, and FIG. 9B shows the case where one Ga atom is present in an upper layer and three Ga atoms are present in a lower layer.

In the case shown in FIG. 9A, Ga atoms in each layer are distributed in the form of stripes. That is, Ga atoms in each layer are distributed in the form of parallel lines.

Considering the combination of the upper and the lower layers, the distributions of Ga atoms are classified into two patterns: a parallel distribution and a cross distribution. The parallel distribution refers to the distribution where Ga lines in the upper layer are in parallel to Ga lines in the lower layer, and the cross distribution refers to the distribution where Ga lines in the upper layer cross Ga lines in the lower layer. In the case of the parallel distribution, there are two possible combinations such as U1+L1 and U1+L4. In the case of the cross distribution, the distribution has a rotationally symmetrical relation; therefore, only one combination like U1+L2 is considered, for example. That is, there are three combinations in total in the case shown in FIG. 9A.

In the case shown in FIG. 9B, as combinations of the upper and the lower layers, there are two possible combinations such as U7+L7 and U7+L10. Note that in the case where all Ga atoms enter either the upper layer or the lower layer, there is one combination of the upper and the lower layers (U11+L11, not shown). Therefore, for the Ga distribution, six combinations may be considered in total.

FIG. 10 shows the result of comparing the energy of the six distribution patterns. InGaZnO$_4$ has the lowest energy in the case where two Ga atoms are present in each of the upper and the lower layer, more specifically, in the case of the structure like U1+L1.

Figure 11:
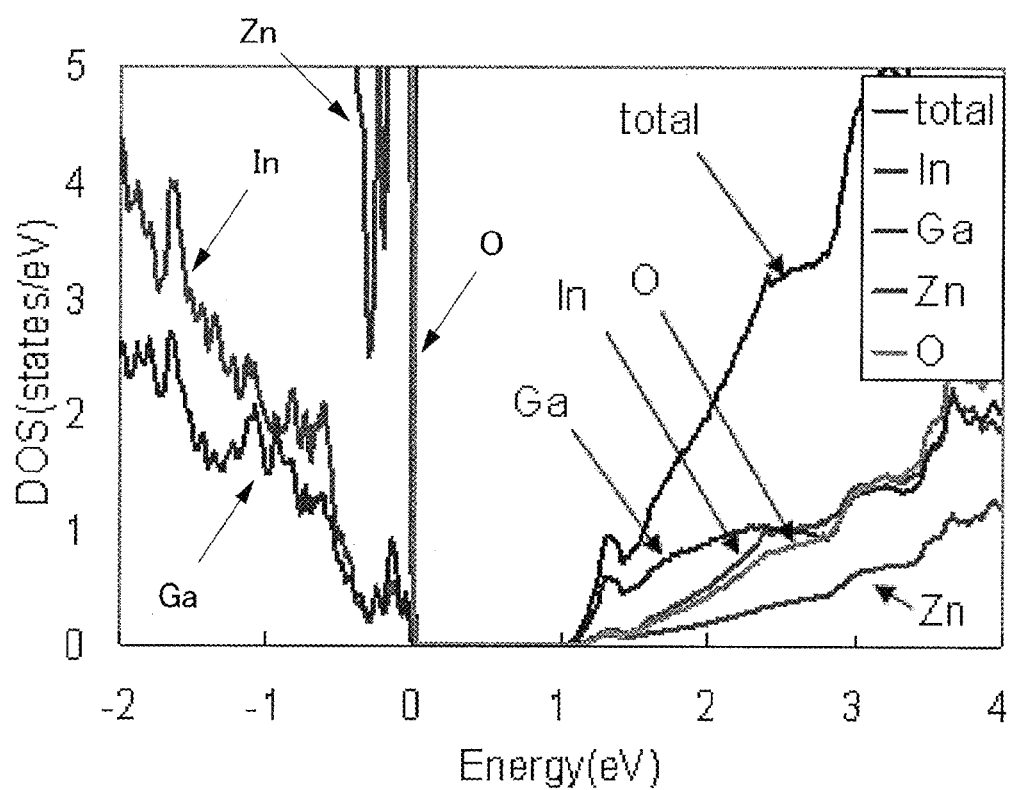
FIG. 11 is a view illustrating the result of calculating DOS and PDOS of electrons.

The electronic structure of this structure (the structure having the lowest energy) is calculated in more detail. FIG. 11 shows the result of calculating density of state (DOS) and projected density of state (PDOS) of electrons in the above structure. According to FIG. 11, Ga atoms are the most dominant, followed by In atoms.

Figure 12A:
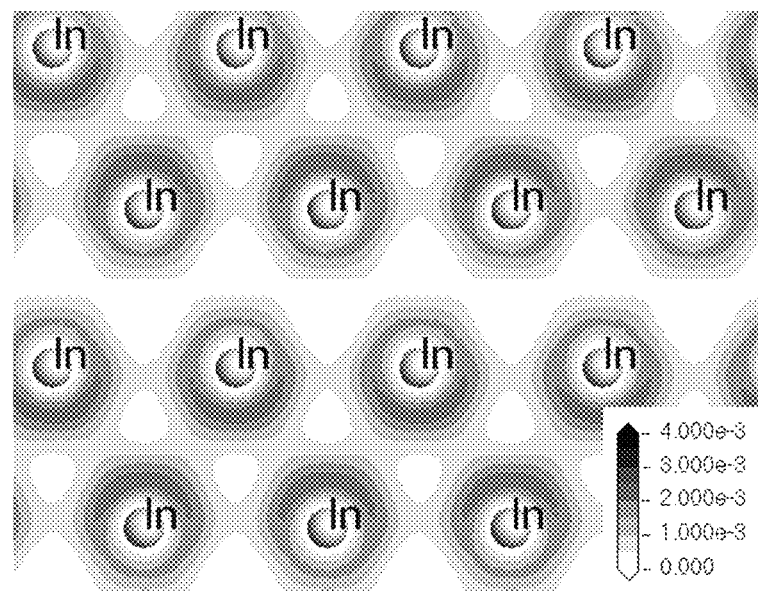
FIGS. 12A and 12B are distribution maps of electrons at the bottom of the conduction band.
Figure 12B:
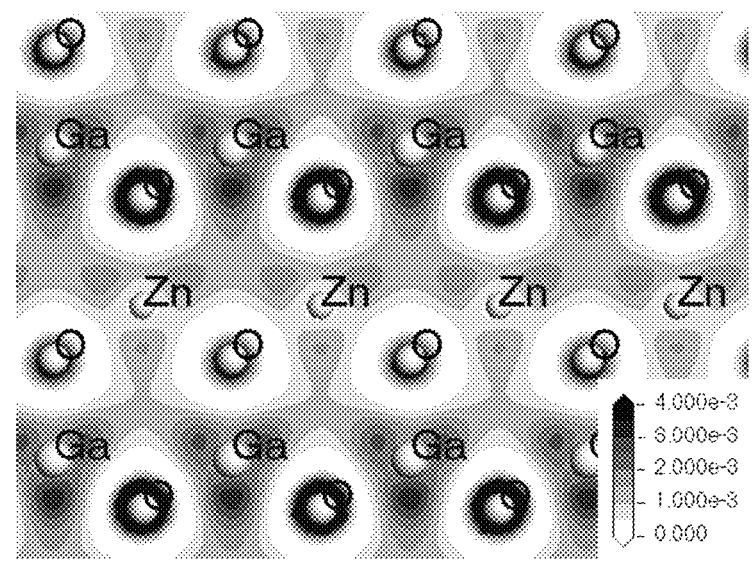
Figure 14A:
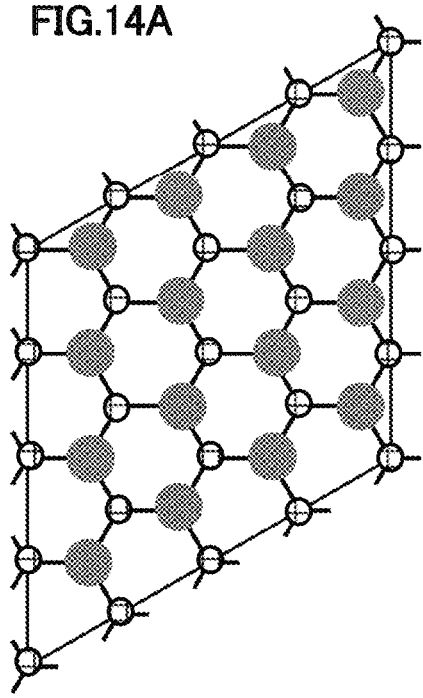
FIGS. 14A to 14D are views illustrating specific combinations (the distributions of atoms) relating to calculation.
Figure 14B:
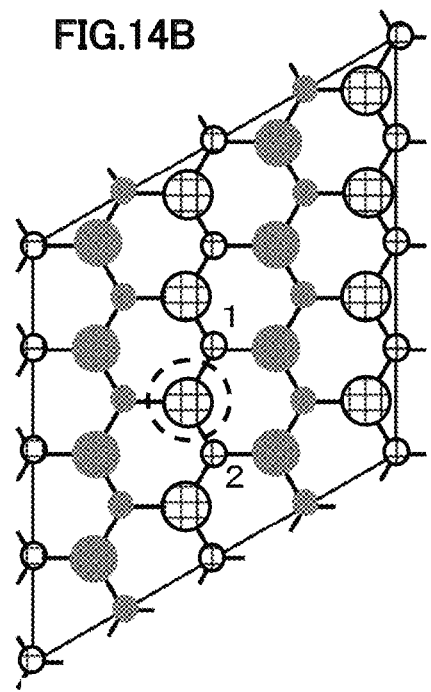
Figure 14C:
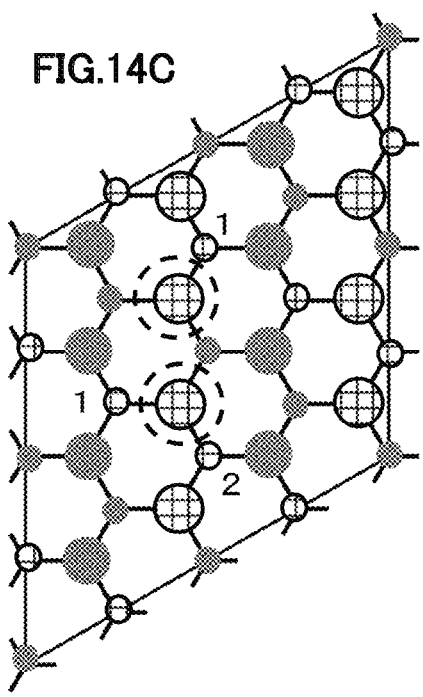
Figure 14D:
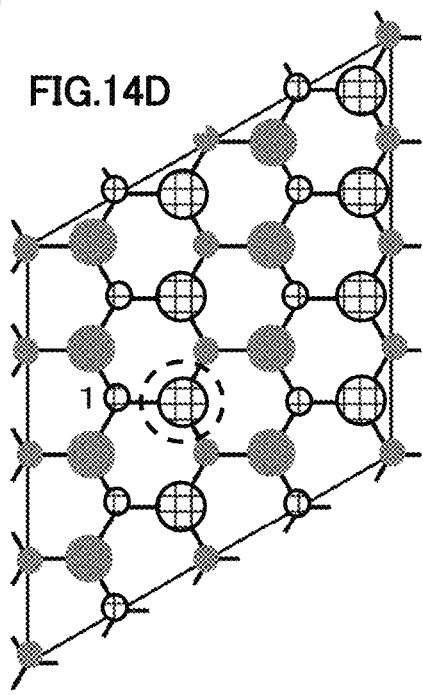

Next, the existing probability of electron $|\Psi|^2$ at the bottom of the conduction band is calculated from an orbital function $\Psi$ at the bottom of the conduction band. FIGS. 12A and 12B show distribution maps thereof. Here, FIG. 12A shows the existing probability of electrons on the plane of In (in the InO$_2$ layer), and FIG. 12B shows the existing probability of electrons in the (Ga, Zn)O$_2$ layer. It is interesting that the In orbitals are separated.

FIG. 12B shows that the existing probability of electrons in the periphery of Ga atoms is high and the existing probability of electrons in the periphery of Zn atoms is low. Further, the electrical conduction path appears to be present not only on the plane of In but also in the (Ga, Zn)O$_2$ layer. From this, it is likely that Ga largely contributes to the electrical conduction of InGaZnO$_4$. It seems that the Ga orbital affects the In orbital and contributes to the electrical conduction of the (Ga, Zn)O$_2$ layer.

One of the features of InGaZnO$_4$ is a wide margin of electrical conductivity. This seems to be due to the probability of formation of oxygen vacancies (defects) because the electrical conductivities widely vary depending on the amount of oxygen added in a process. Thus, in order to clarify this mechanism, the formation energy of oxygen vacancies is calculated.

The energy level of an oxygen vacancy defect which is calculated based on the density functional theory (DFT) is still being argued. For example, a band gap obtained by using a function such as local density approximation (LDA) or GGA tends to be smaller than an actual measurement value. Since the scaling method is still being discussed, the simple GGA function without the scaling method is used here. It is likely that, by using this, artificial phenomena are eliminated and the essence of phenomena can be grasped.

The formation energy of oxygen vacancies (E$_{VO}$) is defined as follows:

$$E_{VO}=E(A_mO_{n-1})+E(O)-E(A_mO_n)$$

Here, E$_{VO}$ is a half of the energy of an oxygen molecule, and E(A$_m$O$_{n-1}$) represents the energy of A$_m$O$_{n-1}$ having oxygen vacancies where A represents an optional element.

FIG. 13 shows the result of calculating geometrical optimal values of E$_{VO}$ in a structure having oxygen vacancies. Here, as a lattice constant, a lattice constant of an ideal crystal is used. High level of E$_{VO}$ means that the density of oxygen vacancies in thermal equilibrium is low. Note that, in FIG. 13, E$_{VO}$ of In$_2$O$_3$, E$_{VO}$ of ZnO, and E$_{VO}$ of Ga$_2$O$_3$ are also shown. Crystal structures of In$_2$O$_3$, ZnO, and Ga$_2$O$_3$ are bixbyite, wurtzite, β-gallia, respectively.

E$_{VO}$ of InGaZnO$_4$ varies depending on elements in the periphery of oxygen vacancies. Specifically, there are three possible structural models as follows. In Model 1, an oxygen vacancy is surrounded by one Zn atom and three In atoms. In Model 2, an oxygen vacancy is surrounded by one Ga atom and three In atoms. In Model 3, an oxygen vacancy is surrounded by two Zn atoms and two Ga atoms. FIG. 13 shows that the level of E$_{VO}$ of InGaZnO$_4$ becomes higher as the number of Ga atoms in the periphery of the oxygen vacancy increases. Further, Ga$_2$O$_3$ has the highest level of E$_{VO}$ in FIG. 13; therefore, it can be said that Ga atoms bond with O atoms tightly.

When InGaZnO$_4$ is in an amorphous state, there are more possible structures in addition to the above three types of models, and the levels of E$_{VO}$ of the structures are slightly different from each other. As the proportion of Ga atoms in InGaZnO$_4$ increases, the density of oxygen vacancies decreases. As the proportion of Ga atoms in InGaZnO$_4$ decreases, the density of oxygen vacancies increases.

Thus, making the proportion of Ga atoms in the non-single-crystal semiconductor layer 102 high enables reduction of the density of oxygen vacancies. That is, an In—Ga—Zn—O based oxide semiconductor with good electrical characteristics can be obtained. Considering the existence of In contributing to electrical conduction, it is not preferable to reduce the proportion of In. Therefore, the proportion of Zn in the non-single-crystal semiconductor layer 102 is preferably made low. For example, the Zn content (atomic %) in the non-single-crystal semiconductor layer 102 may be lower than the In content (atomic %) and lower than the Ga content (atomic %). By making the Zn content in the non-single-crystal semiconductor layer 102 low in this manner, an oxide semiconductor layer with good electrical characteristics can be obtained.

According to this embodiment, a high-performance oxide semiconductor layer can be provided. This embodiment can be implemented in combination with any of other embodiments as appropriate.

(Embodiment 2)

In this embodiment, the result of promoting the consideration of an In—Ga—Zn—O based oxide semiconductor layer in Embodiment 1 is described with reference to drawings.

It is revealed in Embodiment 1 that two (Ga, Zn)O$_2$ layers and one InO$_2$ layer are included in a unit cell of a crystal structure of InGaZnO$_4$. In response to this, the distribution of Ga atoms and Zn atoms is studied in more detail in this embodiment. In specific, some combinations of an upper layer and a lower layer are given as shown in FIGS. 9A and 9B, and the relation between the distribution of Ga atoms and Zn atoms in two (Ga, Zn)O$_2$ layers and the energy is calculated and considered.

FIGS. 14A to 14D illustrate specific combinations (the distributions of atoms) which are subjected to calculation. In this embodiment, these combinations are selected with a focus on the number of nearest neighbor atoms of the same kind. For example, in a combination shown in FIG. 14A, Ga atoms and Zn atoms are distributed in the upper layer and in the lower layer, respectively, such that the Ga atoms and the Zn atoms are separated from each other, whereby the number of nearest neighbor atoms of the same kind is made zero. In a combination shown in FIG. 14B, two atoms of the same kind are present in nearest neighbor positions. In a combination shown in FIG. 14C, one and a half atoms of the same kind are present in nearest neighbor positions. In a combination shown in FIG. 14D, one atom of the same kind is present in a nearest neighbor position. The calculation is performed under the same conditions as Embodiment 1.

FIG. 15 shows the calculation result. In FIG. 15, the structure with the lowest energy is regarded as an origin point (the energy is regarded as 0 eV) to show the energy of each structure.

Figure 16:
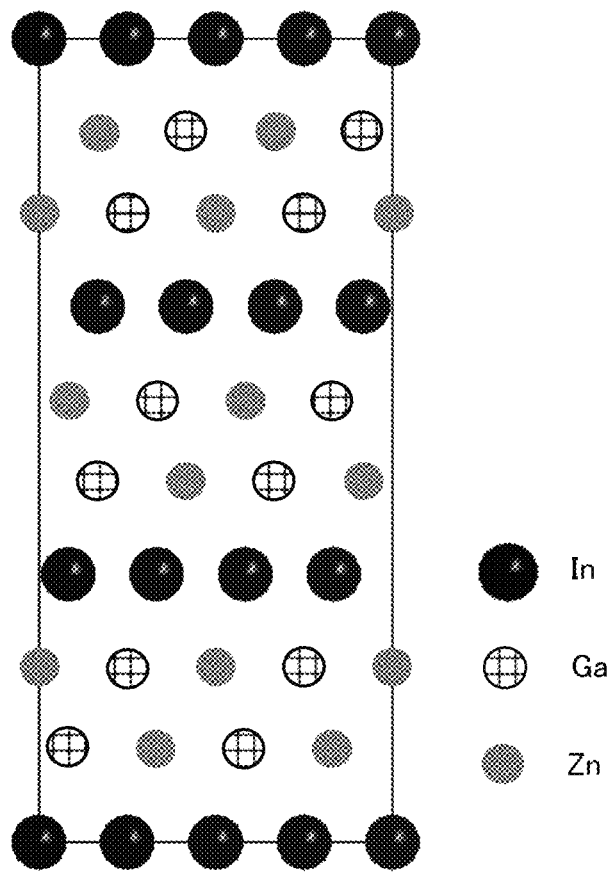
FIG. 16 is a model view of the most possible distribution.

Although the distributions examined in this embodiment are only part of a number of distributions, the tendency of the distribution of Ga atoms and Zn atoms can be read from FIG. 15. It is likely that the result shown in FIG. 15 show that the structure becomes stable in terms of energy as the degree of aggregation of atoms of the same kind becomes lower. Thus, it can be concluded that, in the crystal structure of $InGaZnO_4$, Ga atoms and Zn atoms are not present in an aggregation state as GaO or ZnO but are distributed to be mixed each other in an atom state. FIG. 16 shows a model view of the most possible distribution (corresponding to the distribution (d) in FIG. 15).

This embodiment can be implemented in combination with any of other embodiments as appropriate.

(Embodiment 3)

In this embodiment, an example of a manufacturing process of a semiconductor device using an oxide semiconductor layer manufactured by the method described in Embodiment 1 or the like is described with reference to FIGS. 17A to 17E. Note that in this embodiment, the detailed description of the content which is the same or substantially the same as in Embodiment 1 or the like is omitted.

Figure 17A:
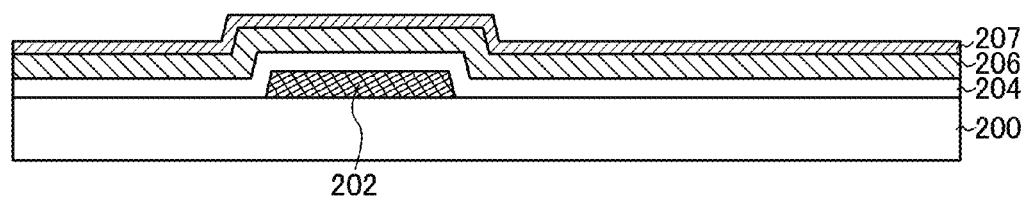
FIGS. 17A to 17E are explanatory views of a manufacturing process of a semiconductor device relating to Embodiment 2.
Figure 17B:
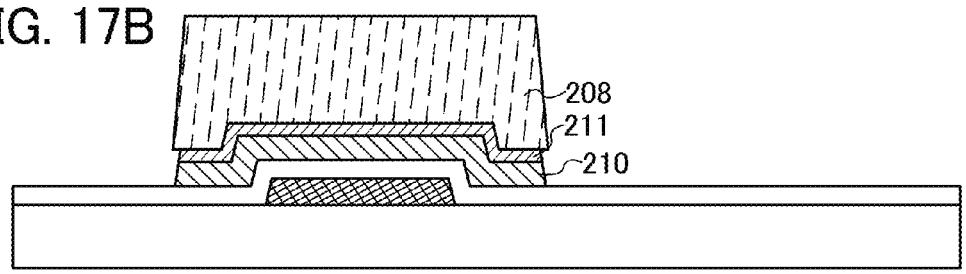

First, a gate electrode 202 is formed over a substrate 200 having an insulating surface, and a gate insulating layer 204 is formed over the gate electrode 202; then, an oxide semiconductor layer 206 and an oxide semiconductor layer 207 are stacked (see FIG. 17A).

As the substrate 200 having an insulating surface, for example, a glass substrate having a visible light transmitting property, which is used for a liquid crystal display device or the like, can be used. The glass substrate is preferably an alkali-free glass substrate. As an alkali-free glass substrate, for example, a glass material such as aluminosilicate glass, aluminoborosilicate glass, or barium borosilicate glass is used. In addition, as the substrate 200 having an insulating surface, an insulating substrate which is formed using an insulator, such as a resin substrate, a ceramic substrate, a quartz substrate, or a sapphire substrate; a semiconductor substrate which is formed using a semiconductor material such as silicon and whose surface is covered with an insulating material; a conductive substrate which is formed using a conductor such as metal or stainless steel and whose surface is covered with an insulating material; or the like can also be used. From the viewpoint of increasing the area of a semiconductor device, specifically, a glass substrate is preferably used. Further, the substrate 200 having an insulating surface preferably has a given heat resistant property.

A conductive layer is formed over an entire surface of the substrate 200 and then the conductive layer is selectively etched using a resist mask formed by a photolithography method, whereby the gate electrode 202 can be formed. At this time, in order to improve the coverage of the gate electrode 202 with the gate insulating layer 204 formed later and preventing disconnection, the gate electrode 202 is preferably etched so that end portions thereof have a tapered shape. Note that the gate electrode 202 includes an electrode and a wiring, such as a gate wiring, formed using the conductive layer.

The gate electrode 202 is desirably formed using a low resistance conductive material such as aluminum (Al) or copper (Cu). Note that in the case where aluminum is used for the wiring and the electrode, aluminum has disadvantages such as low heat resistance and a tendency to be corroded when aluminum is used by itself; therefore, aluminum is preferably used in combination with a heat-resistant conductive material.

As the heat-resistant conductive material, an element selected from titanium (Ti), tantalum (Ta), tungsten (W), molybdenum (Mo), chromium (Cr), neodymium (Nd), and scandium (Sc), an alloy including any of the above elements as its component, an alloy including a combination of any of these elements, a nitride including any of the above elements as its component, or the like can be used. A film formed using such a heat-resistant conductive material and aluminum (or copper) are stacked, so that the wiring and the electrode can be formed.

The gate insulating layer 204 can be formed using a silicon oxide film, a silicon oxynitride film, a silicon nitride film, a silicon nitride oxide film, an aluminum oxide film, a tantalum oxide film, or the like. Alternatively, the gate insulating layer 204 may be formed using a stack of these films. The film can be formed to a thickness of 20 nm to 250 nm inclusive by a sputtering method or the like. For example, as the gate insulating layer 204, a silicon oxide film is formed to a thickness of 100 nm by a sputtering method. Note that the gate insulating layer 204 may serve as a gate insulating layer of a transistor, and the manufacturing method, the thickness, and the like of the gate insulating layer 204 are not construed as being limited to the range of the numeric values described above.

Note that before the oxide semiconductor layer 206 is formed over the gate insulating layer 204, a surface of the gate insulating layer 204 may be subjected to plasma treatment. Dust attaching to the surface of the gate insulating layer 204 can be removed by the plasma treatment.

An inert gas such as an argon (Ar) gas is introduced into a vacuum chamber, and a bias voltage is applied to a processing object (here, the substrate 200 over which the gate insulating layer 204 is formed) so that a plasma state is generated, whereby the above-described plasma treatment can be performed. In this case, electrons and cations of Ar are present in the plasma and the cations of Ar are accelerated in a cathode direction (toward the substrate 200 side). The accelerated cations of Ar collide with the surface of the gate insulating layer 204, whereby the surface of the gate insulating layer 204 is etched by sputtering so as to be reformed. In place of an argon gas, a helium gas may be used. Alternatively, the plasma treatment may be performed in an argon atmosphere to which oxygen, hydrogen, nitrogen, and/or the like is added. Further alternatively, the plasma treatment may be performed in an argon atmosphere to which chlorine ($Cl_2$), carbon tetrafluoride ($CF_4$), and/or the like is added. Such plasma treatment described above may also be referred to as "reverse sputtering".

The oxide semiconductor layer 206 can be formed using an In—Ga—Zn—O based non-single-crystal semiconductor layer. For example, the oxide semiconductor layer 206 is formed by a sputtering method using an oxide semiconductor target including indium (In), gallium (Ga), and zinc (Zn) ($In_2O_3:Ga_2O_3:ZnO=1:1:1$). For the sputtering conditions, Embodiment 1 and the like can be referred to.

Note that a pulsed DC power source is preferably used in the sputtering because dust can be reduced and thickness can be uniformed. In addition, the above plasma treatment is performed and then the oxide semiconductor layer 206 is formed without being exposed to the air, so that dust or moisture can be prevented from attaching to the interface between the gate insulating layer 204 and the oxide semiconductor layer 206. The thickness of the oxide semiconductor layer 206 may be approximately 5 nm to 500 nm.

The oxide semiconductor layer 207 can be formed using an In—Ga—Zn—O based non-single-crystal semiconductor layer in a manner similar to the oxide semiconductor layer 206. For example, the oxide semiconductor layer 207 can be formed over the oxide semiconductor layer 206 by a sputtering method using an oxide semiconductor target including In, Ga, and Zn ($In_2O_3$:$Ga_2O_3$:ZnO=1:1:1). At this time, it is preferable that the oxide semiconductor layer 207 be successively formed without exposing the oxide semiconductor layer 206 to the air. For example, the following conditions may be employed for the sputtering: the temperature is 20° C. to 100° C.; the pressure is 0.1 Pa to 2.0 Pa; and the DC power source is 250 W to 3 kW (when the target with a size of 8-inch in diameter is used). Further, an argon gas may be introduced into the atmosphere.

The oxide semiconductor layer 206 and the oxide semiconductor layer 207 are preferably formed under the different film formation conditions. For example, in the film formation conditions of the oxide semiconductor layer 206, the flow rate ratio of an oxygen gas to an argon gas is made higher than that in the film formation conditions of the oxide semiconductor layer 207. Specifically, the oxide semiconductor layer 207 is formed in a noble gas (such as argon or helium) atmosphere (or an atmosphere containing oxygen at 10% or less and a noble gas at 90% or more), and the oxide semiconductor layer 206 is formed in an oxygen atmosphere or an atmosphere in which the flow rate of an oxygen gas is equal to or more than the flow rate of a noble gas). Accordingly, the oxide semiconductor layer 207 which is higher in electrical conductivity than the oxide semiconductor layer 206 can be formed.

As the above sputtering method for forming the oxide semiconductor layer 206 and the oxide semiconductor layer 207, an RF sputtering method in which a high frequency power source is used as a sputtering power source, a DC sputtering method, a pulsed DC sputtering method in which direct current bias is applied in pulses, or the like can be employed.

Alternatively, a multi-target sputtering apparatus which can be provided with a plurality of targets formed using different materials may be used. In a multi-target sputtering apparatus, a stack of different films can be formed in one chamber, or one film can be formed by sputtering using plural kinds of materials at the same time in one chamber. Alternatively, a method using a magnetron sputtering apparatus in which a magnetic field generating system is provided inside the chamber (a magnetron sputtering method), an ECR sputtering method in which plasma generated by using a microwave is used, or the like may be employed. Further alternatively, a reactive sputtering method in which a target substance and a sputtering gas component are chemically reacted with each other to form a compound thereof at the time of film formation, a bias sputtering method in which a voltage is applied also to the substrate at the time of film formation, or the like may be employed.

Note that in this embodiment, an example of the case where the oxide semiconductor layer 206 and the oxide semiconductor layer 207 are stacked is described; however, the invention to be disclosed is not limited thereto. For example, the structure without the oxide semiconductor layer 207 (the structure in which only the oxide semiconductor layer 206 is formed) may be used.

Next, a resist mask 208 is formed over the oxide semiconductor layer 207. Then, the oxide semiconductor layer 206 and the oxide semiconductor layer 207 are selectively etched using the resist mask 208, so that an island-shaped oxide semiconductor layer 210 and an island-shaped oxide semiconductor layer 211 are formed (see FIG. 17B).

As the above etching, wet etching is preferably employed. Here, the island-shaped oxide semiconductor layer 210 and the island-shaped oxide semiconductor layer 211 are formed by removing an unnecessary portion of the oxide semiconductor layer 206 and the oxide semiconductor layer 207 by wet etching with the use of ITO07N (manufactured by Kanto Chemical Co., Inc.) or a mixed solution of acetic acid, nitric acid, and phosphoric acid. Note that after the above etching, the resist mask 208 is removed. In addition, an etchant for the wet etching is not limited to the above solution as long as the oxide semiconductor layer 206 and the oxide semiconductor layer 207 can be etched using the etchant. Of course, dry etching may be used as the above etching.

Figure 17C:
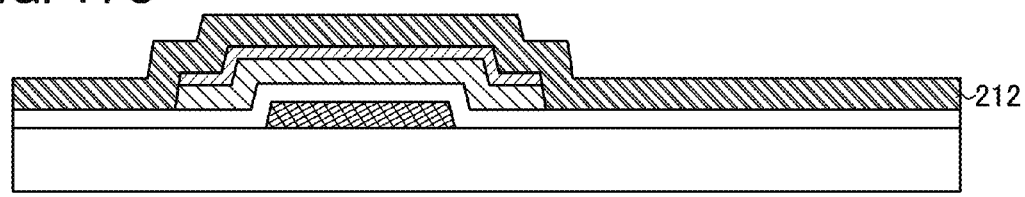

Next, a conductive layer 212 is formed over the island-shaped oxide semiconductor layer 211 (see FIG. 17C).

The conductive layer 212 can be formed by a sputtering method, a vacuum evaporation method, or the like, using a metal including an element selected from aluminum (Al), copper (Cu), titanium (Ti), tantalum (Ta), tungsten (W), molybdenum (Mo), chromium (Cr), neodymium (Nd), and scandium (Sc), an alloy including any of the above elements as its component, an alloy including a combination of any of these elements, or a nitride including any of the above elements as its component. Note that in this embodiment, heat treatment (e.g., heat treatment at 350° C. to 800° C. (preferably, 500° C. to 750° C.)) is performed after formation of the conductive layer 212; therefore, the conductive layer 212 preferably has a given heat resistant property.

For example, the conductive layer 212 can be formed with a single-layer structure of a titanium film. Alternatively, the conductive layer 212 is formed with a stacked-layer structure. For example, the conductive layer 212 can be formed with a stacked-layer structure of an aluminum film and a titanium film. Further alternatively, a three-layer structure of a titanium film, an aluminum film including a neodymium (Al—Nd) film, and a titanium film may be employed. Further alternatively, the conductive layer 212 may be formed with a single-layer structure of an aluminum film including silicon.

Next, a resist mask 214a, a resist mask 214b, and a resist mask 214c are formed over the conductive layer 212, and the conductive layer 212 is selectively etched so that a conductive layer 216a, a conductive layer 216b, and a conductive layer 218 are formed. In addition, the island-shaped oxide semiconductor layer 211 is etched so that a semiconductor region 215a with high conductivity and a semiconductor region 215b with high conductivity are formed. Further, part of the island-shaped oxide semiconductor layer 210 (the part near a surface thereof) is removed (channel-etched) (see FIG. 17D).

Figure 17D:
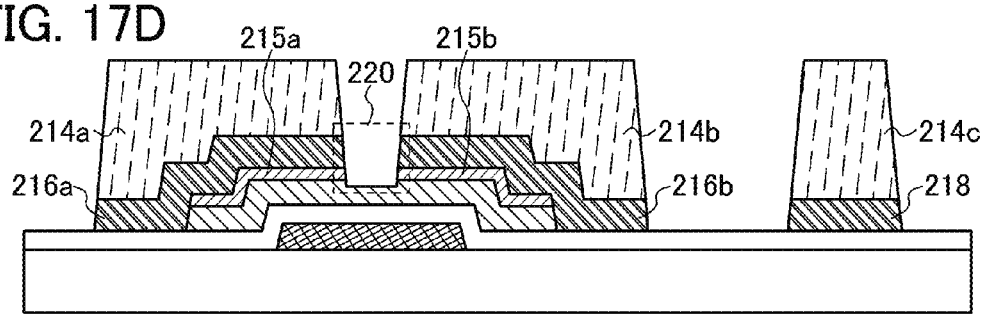

A recessed portion 220 formed by removing the part of the island-shaped oxide semiconductor layer 210 and part of the island-shaped oxide semiconductor layer 211 corresponds to a region which is between the conductive layer 216a and the conductive layer 216b and also between the semiconductor region 215a with high conductivity and the semiconductor region 215b with high conductivity. Therefore, the conductive layer 216a functions as one of a source electrode and a drain electrode of the transistor, while the conductive layer 216b functions as the other of the source electrode and the drain electrode. As illustrated in FIG. 17D, the recessed portion 220 is formed by removing the part of the oxide semiconductor layer 210 and the part of the island-shaped oxide semiconductor layer 211, whereby the conductive layer 216a and the conductive layer 216b can be electrically insulated from each other without fault. In addition, the conductive layer 218 functions as a wiring which electrically connects transistors and the like.

As the above etching, dry etching is preferably employed. By employing dry etching, a wiring structure or the like can be miniaturized as compared to the case of using wet etching. In addition, by employing dry etching, etching is performed with high controllability; therefore, the removal of the part of the island-shaped oxide semiconductor layer 210 (the formation of the recessed portion 220) can be performed with high controllability. As the gas which can be used for the dry etching, a chlorine-based gas such as chlorine ($Cl_2$), boron chloride ($BCl_3$), silicon chloride ($SiCl_4$), or carbon tetrachloride ($CCl_4$); a fluorine-based gas such as carbon tetrafluoride ($CF_4$), sulfur fluoride ($SF_6$), nitrogen fluoride ($NF_3$), or trifluoromethane ($CHF_3$); hydrogen bromide (HBr); oxygen ($O_2$); any of these gases to which a noble gas such as helium (He), or argon (Ar) is added; or the like can be used. Of course, wet etching may be used as the above etching.

In addition, as a material for the conductive layer 212, a material whose etching rate is higher than that of the island-shaped oxide semiconductor layer 210 or the island-shaped oxide semiconductor layer 211 is preferably used. This is because when the conductive layer 212, the island-shaped oxide semiconductor layer 210, and the island-shaped oxide semiconductor layer 211 are etched at one time, the etching rates of the island-shaped oxide semiconductor layer 210 and the island-shaped oxide semiconductor layer 211 are made smaller than that of the conductive layer 212, so that the island-shaped oxide semiconductor layer 210 can be prevented from being etched excessively.

Note that the resist mask 214a, the resist mask 214b, and the resist mask 214c are removed after the above etching.

After that, heat treatment is performed at a given temperature (for example, 350° C. to 800° C. (preferably 500° C. to 750° C.)). Note that in the case where a glass substrate is used as the substrate 200 having an insulating surface, it is necessary to perform heat treatment at a temperature lower than or equal to the strain point of the glass substrate. The heat treatment may be performed in an air atmosphere or a nitrogen atmosphere. By the heat treatment, crystal grains of an oxide semiconductor are grown in the island-shaped oxide semiconductor layer 210. Thus, an oxide semiconductor layer including crystal grains represented by $InGaO_3(ZnO)_m$ (m=1) in an amorphous structure represented by $InGaO_3(ZnO)_m$ (m>0) (an In—Ga—Zn—O based semiconductor layer) can be obtained.

An oxide semiconductor with an amorphous structure easily becomes an oxide semiconductor with a crystal structure due to heat or the like. Therefore, in the case where the proportion of the amorphous structure is high, a transistor tends to reduce its reliability. From the viewpoint of increasing the reliability, the heat treatment is performed so that the proportion of the amorphous structure is 90 volume % or less (preferably 80 volume % or less, more preferably 60 volume % or less).

Although heat treatment time can be changed in relation with heat treatment temperature as appropriate, for example, the heat treatment time can be approximately 0.5 hour to 2 hours at a temperature of 700° C. Further, since a temperature suitable for the heat treatment depends on the composition of an intended oxide semiconductor, there is no particular limitation on the heat treatment temperature as long as a desired oxide semiconductor layer can be obtained.

Note that, for the above heat treatment, a diffusion furnace, a heating furnace such as a resistance heating furnace, a rapid thermal annealing (RTA) apparatus, a microwave heating apparatus, or the like can be used. The irradiation with light having a wavelength which is absorbed by an oxide semiconductor (an electromagnetic wave) may be performed instead of the heat treatment. That is, the structure including crystal grains in an amorphous structure may be realized by irradiation with light (an electromagnetic wave). In this case, a laser capable of oscillating light having a short wavelength, an ultraviolet lamp, or the like may be used as a light source.

As described above, an oxide semiconductor layer including crystal grains represented by $InGaO_3(ZnO)_m$ (m=1) in an amorphous structure represented by $InGaO_3(ZnO)_m$ (m>0) is used for a channel formation region of a transistor, whereby a high-performance semiconductor device can be provided.

Here, in order to realize an oxide semiconductor layer with good electrical characteristics, a Zn content (atomic %) in an oxide semiconductor is preferably set lower than an In content (atomic %) and lower than a Ga content (atomic %), for example. With such a composition, an oxide semiconductor layer with good electrical characteristics can be obtained.

Note that an oxide semiconductor layer with a Zn content (atomic %) lower than an In content (atomic %) and lower than a Ga content (atomic %) as described above can be formed by a sputtering method using a target with a composition close to an intended composition. In this case, considering FIGS. 2 and 3, a decreasing proportion of Zn in a formed oxide semiconductor layer as compared to the proportion of Zn in a composition of the target is larger than those of In and Ga. Therefore, a target with a Zn content (atomic %) equal to an In or Ga content (atomic %) may be used in order to form an oxide semiconductor layer with a Zn content (atomic %) lower than an In or Ga content (atomic %), for example. That is, a target with a Zn content (atomic %) lower than or equal to an In or Ga content (atomic %) may be used.

Here, in this embodiment, an example of the case where the heat treatment is performed after the island-shaped semiconductor layer 210 is formed is given. However, there is no particular limitation on the timing of performing the heat treatment as long as the heat treatment is performed after the island-shaped semiconductor layer 206 is formed. Further, the heat treatment is not needed if a structure including a plurality of crystal grains in an amorphous structure (a structure in which a plurality of crystal grains are dispersed in an amorphous structure) is obtained at the stage of film formation.

Note that the recessed portion 220 of the exposed part of the island-shaped oxide semiconductor layer 210 may be subjected to oxygen radical treatment. By performing the oxygen radical treatment, the thin film transistor in which the island-shaped oxide semiconductor layer 210 is a channel formation region can be easily normally off. Further, by performing radical treatment, damage to the island-shaped oxide semiconductor layer 210 due to etching can be repaired. The radical treatment is preferably performed under an $O_2$ atmosphere; an $N_2O$ atmosphere; an $N_2$, He, or Ar atmosphere including oxygen; or the like. In addition, radical treatment may be performed under an atmosphere in which $Cl_2$ and/or $CF_4$ is added to the above atmosphere. Note that radical treatment is preferably performed without application of a bias voltage on the substrate 200 side.

Figure 17E:
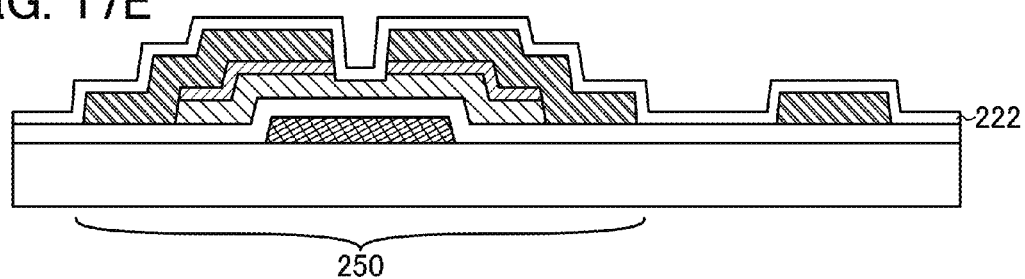

Next, a protective insulating layer 222 is formed so as to cover the thin film transistor 250 including the gate electrode 202, the island-shaped oxide semiconductor layer 210, the semiconductor region 215a with high conductivity, the semiconductor region 215b with high conductivity, the conductive layer 216a, the conductive layer 216b, and the like (see FIG. 17E). The protective insulating layer 222 may be formed by a sputtering method or the like using a material including silicon nitride, silicon oxide, silicon nitride oxide, silicon oxynitride, aluminum oxide, tantalum oxide, or the like.

After that, various kinds of electrodes and wirings are formed. Thus, the semiconductor device is completed.

According to this embodiment, a high-performance semiconductor device can be provided. Note that this embodiment can be implemented in combination with any of other embodiments as appropriate.

This application is based on Japanese Patent Application serial no. 2008-296901 filed with Japan Patent Office on Nov. 20, 2008, the entire contents of which are hereby incorporated by reference.

What is claimed is:

1. A method for manufacturing a semiconductor device comprising steps of:
   forming an oxide semiconductor layer containing In, Ga, and Zn so that the oxide semiconductor layer comprises a crystal region comprising a crystal; and
   forming a conductive layer containing copper over the oxide semiconductor layer,
   wherein the oxide semiconductor layer is formed using a target of In:Ga:Zn=2:2:1,
   wherein the crystal is represented by InGaZnO$_4$,
   wherein each of an In content, a Ga content, and a Zn content in the oxide semiconductor layer is identified by inductively coupled plasma mass spectrometry,
   wherein the Zn content is less than the In content and the Ga content, and
   wherein the Ga content is less than the In content.

2. The method for manufacturing a semiconductor device according to claim 1, wherein the oxide semiconductor layer is formed over and in contact with an insulating layer.

3. The method for manufacturing a semiconductor device according to claim 2, wherein the insulating layer comprises at least one film selected from a silicon oxide film, a silicon oxynitride film, a silicon nitride film, and a silicon nitride oxide film.

4. The method for manufacturing a semiconductor device according to claim 1, further comprising forming a protective insulating layer over and in contact with the oxide semiconductor layer and the conductive layer.

5. The semiconductor device according to claim 1, wherein the oxide semiconductor layer has a depression.

6. The method for manufacturing a semiconductor device according to claim 1, further comprising performing an oxygen radical treatment on the oxide semiconductor layer.

7. The method for manufacturing a semiconductor device according to claim 6, wherein the oxygen radical treatment is performed under an N$_2$O atmosphere.

8. A method for manufacturing a semiconductor device comprising steps of:
   forming an oxide semiconductor layer containing In, Ga, and Zn so that the oxide semiconductor layer comprises a crystal region comprising a crystal; and
   forming a conductive layer containing copper over the oxide semiconductor layer,
   wherein the oxide semiconductor layer is formed using a target of In:Ga:Zn=2:2:1,
   wherein the crystal is represented by InGaZnO$_4$,
   wherein each of an In content, a Ga content, and a Zn content in the oxide semiconductor layer is identified by Rutherford backscattering spectrometry,
   wherein the Zn content is less than the In content and the Ga content, and
   wherein the Ga content is less than the In content.

9. The method for manufacturing a semiconductor device according to claim 8, wherein the oxide semiconductor layer is formed over and in contact with an insulating layer.

10. The method for manufacturing a semiconductor device according to claim 9, wherein the insulating layer comprises at least one film selected from a silicon oxide film, a silicon oxynitride film, a silicon nitride film, and a silicon nitride oxide film.

11. The method for manufacturing a semiconductor device according to claim 8, further comprising forming a protective insulating layer over and in contact with the oxide semiconductor layer and the conductive layer.

12. The method for manufacturing a semiconductor device according to claim 8, wherein the oxide semiconductor layer has a depression.

13. The method for manufacturing a semiconductor device according to claim 8, further comprising performing an oxygen radical treatment on the oxide semiconductor layer.

14. The method for manufacturing a semiconductor device according to claim 13, wherein the oxygen radical treatment is performed under an N$_2$O atmosphere.

* * * * *